(12) United States Patent
Partsch et al.

(10) Patent No.: US 7,139,943 B2
(45) Date of Patent: Nov. 21, 2006

(54) METHOD AND APPARATUS FOR PROVIDING ADJUSTABLE LATENCY FOR TEST MODE COMPRESSION

(75) Inventors: Torsten Partsch, Chapel Hill, NC (US); Biju Velayudhan, Cary, NC (US); Christopher W. Kunce, Wake Forest, NC (US)

(73) Assignee: Infineon Technologies AG, Munich (DE)

( * ) Notice: Subject to any disclaimer, the term of this patent is extended or adjusted under 35 U.S.C. 154(b) by 569 days.

(21) Appl. No.: 10/113,386

(22) Filed: Mar. 29, 2002

(65) Prior Publication Data

US 2003/0188238 A1   Oct. 2, 2003

(51) Int. Cl.
G11C 29/00 (2006.01)
G11C 7/00 (2006.01)
(52) U.S. Cl. .................. 714/718; 714/48; 714/733; 365/201
(58) Field of Classification Search .................. 714/48, 714/812, 724, 718, 732, 734, 799; 710/68; 365/201
See application file for complete search history.

(56) References Cited

U.S. PATENT DOCUMENTS

| 6,014,759 | A  | * | 1/2000 | Manning | 714/42 |
| 6,286,115 | B1 | * | 9/2001 | Stubbs | 714/718 |
| 6,360,340 | B1 | * | 3/2002 | Brown et al. | 714/718 |
| 6,438,048 | B1 | * | 8/2002 | Kumar | 365/201 |
| 6,584,025 | B1 | * | 6/2003 | Roohparvar et al. | 365/201 |

* cited by examiner

*Primary Examiner*—Albert Decady
*Assistant Examiner*—John P. Trimmings
(74) *Attorney, Agent, or Firm*—Patterson & Sheridan, L.L.P.

(57) ABSTRACT

An integrated circuit includes a core memory array and a test mode compression circuit. The test mode compression circuit receives test mode data from the core memory array. A multiplexer receives read data from the core memory array and test mode data from the test mode compression circuit. The multiplexer receives a test mode compression signal and selectively transfers one of the read data and the test mode data dependent at least in part upon the test mode compression signal.

8 Claims, 2 Drawing Sheets

METHOD AND APPARATUS FOR PROVIDING ADJUSTABLE LATENCY FOR TEST MODE COMPRESSION

FIELD OF THE INVENTION

The present invention relates generally to integrated circuits, and, more particularly, to integrated circuit memory devices.

BACKGROUND OF THE INVENTION

Integrated circuits (ICs) are often very complex devices from both a structural and functional standpoint. The testing of such structurally and functionally complex devices is often equally complex. ICs are typically tested using sophisticated testing machines employing SPecific testing modes to ensure the functionality of the device. One test mode commonly used with memory chips, such as, for example, synchronous dynamic random access memory (SDRAM) chips, is test mode compression.

Test mode compression is a test mode that reduces the amount of time required to test the memory array or core of a memory chip. Generally, test mode compression condenses the test information from individual memory cells of a replaceable array section to a single bit that indicates whether that particular array section of memory cells passed or failed the functional test, and/or whether that array section is to be replaced by a redundant array section. Although the method of test mode compression reduces the amount of time required to test the memory array relative to directly reading and testing each individual memory cell separately or individually, testing an IC using test mode compression is still a relatively time consuming process.

The method of test mode compression conventionally stores the condensed data read from the memory array into a dedicated test mode compression register. The test mode compression register consumes valuable substrate space and adds complexity to the integrated circuit. Data in the test mode register is driven to an off-chip driver after a predetermined number of clock cycles, referred to as fixed latency. The depth of the test mode register fixes the latency period. The data in the test mode register is only driven to the off-chip driver at the expiration of the fixed latency period. Fixing the latency period also limits the maximum operational frequency at which the test can be administered. The depth of the register can be increased to increase the fixed latency period, thereby increasing the frequency at which the test can be administered. However, increasing the depth of the register consumes more valuable substrate space. Increasing the depth of the register also decreases the bandwidth, especially at lower operating frequencies.

Therefore, what is needed in the art is a method and apparatus for test mode compression that eliminates the need for a test mode compression register, thereby saving substrate space.

Furthermore, what is needed in the art is a method and apparatus for test mode compression that enables the latency period to be adjustable.

Moreover, what is needed in the art is a method and apparatus for test mode compression that enables testing at a higher frequency with a greater number of clock cycles between read operations.

SUMMARY OF THE INVENTION

The present invention provides an integrated circuit that provides adjustable latency to the data provided during the test mode compression mode of operation.

The invention comprises, in one form thereof, a core memory array and a test mode compression circuit. The test mode compression circuit receives test mode data from the core memory array. A multiplexer receives read data from the core memory array and test mode data from the test mode compression circuit. The multiplexer receives a test mode compression signal and selectively transfers one of the read data and the test mode data dependent at least in part upon the test mode compression signal.

An advantage of the present invention is that adjustable latency is provided in the test mode compression mode of operation.

Another advantage of the present invention is that the adjustable latency is provided using existing circuitry, thereby saving space on the substrate of the integrated circuit.

Yet another advantage of the present invention is that the need for a dedicated test mode compression register is eliminated.

A still further advantage of the present invention is that an adjustable number of clock cycles can be accommodated between read operations.

BRIEF DESCRIPTION OF THE DRAWINGS

The above-mentioned and other features and advantages of this invention, and the manner of attaining them, will become appreciated and be more readily understood by reference to the following detailed description of one embodiment of the invention in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE DRAWINGS

Figure 1:
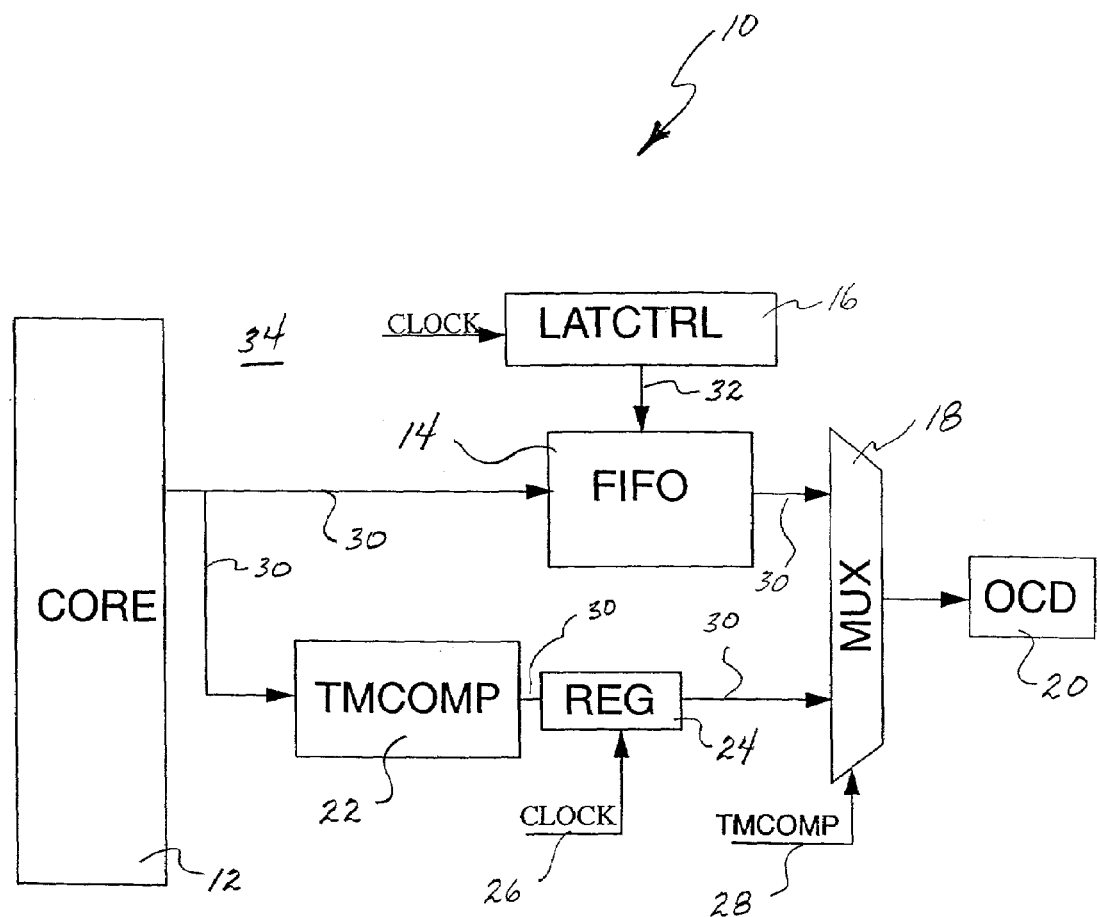
FIG. 1 is a block diagram of a conventional integrated circuit memory chip configured to implement test mode compression.

Referring now to FIG. 1, an integrated circuit (IC) 10 having a conventional implementation of test mode compression is shown. IC 10, such as, for example, an SDRAM, includes memory array or core 12, first in first out register (FIFO) 14, latency control (LATCTRL) 16, multiplexer (MUX) 18, off-chip driver (OCD) 20, test mode compression circuit (TMCOMP) 22 and test mode compression register (REG) 24. LATCTRL circuit 16 and REG 24 are each connected to a periodic clock signal CLK signal 26, and MUX 18 receives TMCOMP signal 28 that is active when IC 10 is operated in the test mode compression of operation. Data bus 30 electrically interconnects the various circuitry of IC 10, as is described more particularly hereinafter. LATCTRL circuit 16 issues LAT signal 32 to FIFO 14. IC 10 is formed on substrate 34.

Core 12 is electrically connected by data bus 30 to FIFO 14 and TMCOMP circuit 22. FIFO 14 is electrically connected by data bus 30 to MUX 18 which, in turn, is connected thereby to OCD 20. TMCOMP circuit 22 is electrically connected by data bus 30 to REG 24 which, in turn, is connected thereby to OCD 20 via MUX 18.

An overview of the process by which a normal, i.e., non-test mode, data read operation occurs in IC 10 is first described. During a normal data read operation, TMCOMP signal 28 is not active. Data from a desired memory cell is accessed, placed onto data bus 30, and stored in FIFO 14. After an adjustable number of clock cycles, LATCTRL 16 makes latency signal LAT 32 active thereby enabling FIFO 14 to drive the read data onto data bus 30 and into MUX 18. The inactive TMCOMP signal 28 configures MUX 18 to pass the data from FIFO 14 to OCD 20.

An overview of the operation of IC 10 in the test mode compression mode of operation is now provided. With IC 10 operating in test mode compression, TMCOMP signal 28 is active. Test read data from a desired memory cell of core 12 is placed onto data bus 30 and into TMCOMP circuit 22, which, as is known in the art, condenses the test read data. The condensed test read data is then driven into REG 24. After a fixed number of cycles of CLK signal 26, REG 24 places the test read data onto data bus 30. The active TMCOMP signal 28 configures MUX 18 to pass the data from REG 24 and to OCD 20.

Thus, it is seen that normal read data follows a first or read data path, i.e., from core 12, to FIFO 14, through MUX 18 and to OCD 20. A second or test data path is followed by test read data, i.e., from core 12, to TMCOMP circuit 22, to REG 24, through MUX 18 and to OCD 20. REG 24 in the second or test data path provides a fixed latency, whereas LATCTRL circuit 16 provides a variable or adjustable latency in the first or read data path.

Figure 2:
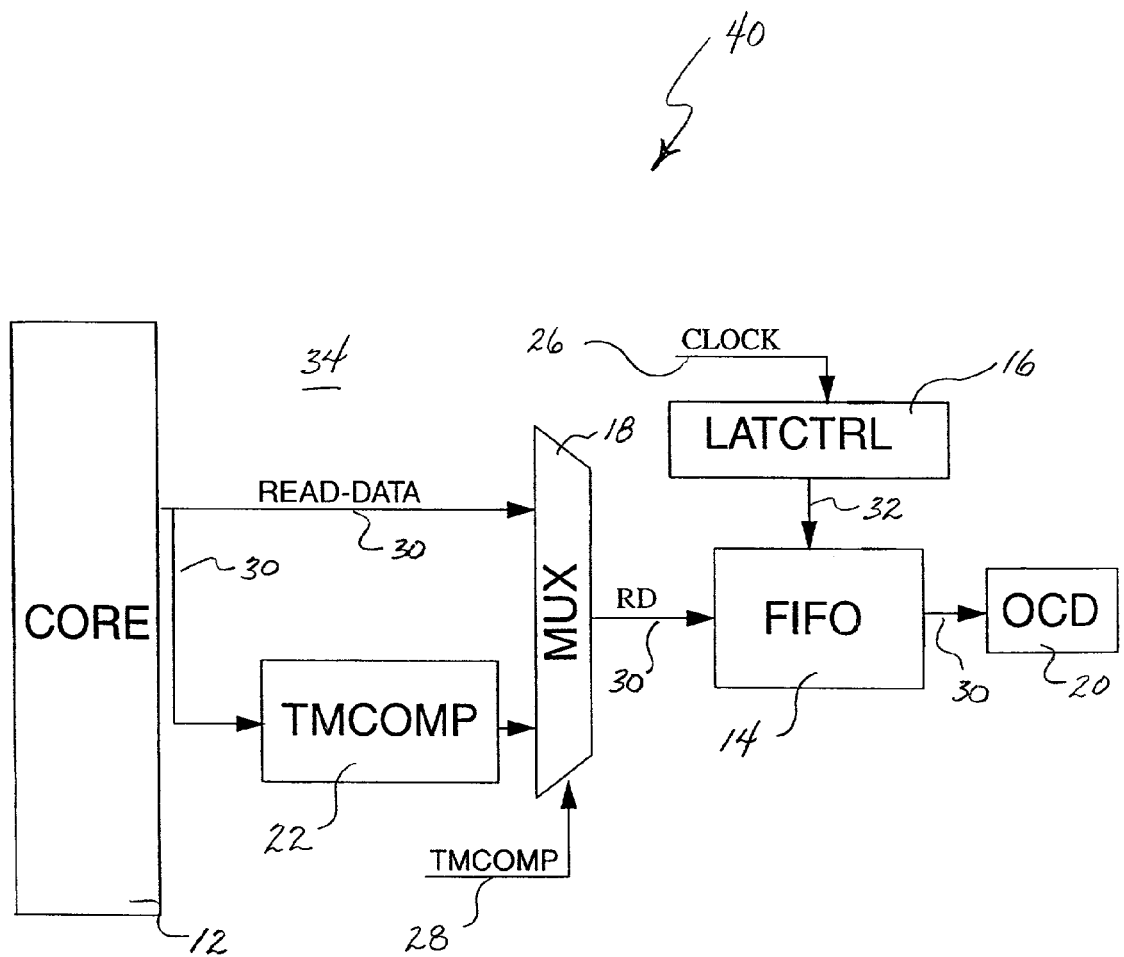
FIG. 2 is a block diagram of one embodiment of an integrated circuit memory chip of the present invention.

Referring now to FIG. 2, one embodiment of an IC of the present invention is shown. IC 40 includes circuits and/or components that correspond to IC 10 (FIG. 1) in function and in design, and corresponding reference numbers are used to refer to these corresponding parts. IC 40 includes core 12, FIFO 14, LATCTRL circuit 16, MUX 18, OCD 20, and TMCOMP circuit 22. In contrast to IC 10, IC 40 does not include REG 24. Further in contrast to IC 10, data bus 30 of IC 40 interconnects core 12 with each of TMCOMP circuit 22 and MUX 18, connects MUX 18 to FIFO 14, and connects FIFO 14 to OCD 20. LATCTRL circuit 16 of IC 40 receives CLK signal 26 and issues LAT signal 32 to FIFO 14. MUX 18 receives TMCOMP signal 28, which, as described above in regard to IC 10, is active when operation of IC 40 is operated in the test mode compression mode of operation.

IC 40 also includes two separate data paths, i.e., a first or read data path and a second or test data path. During a normal, i.e., non-test mode compression, data read operation, TMCOMP signal 28 is not active. Data from a desired memory cell of IC 40 is accessed, placed onto data bus 30, and is thereby provided to MUX 18. The inactive TMCOMP signal 28 configures MUX 18 to pass the read data to FIFO 14. After an adjustable number of clock cycles, LATCTRL 16 makes latency signal LAT 32 active and thereby enables FIFO 14 to drive the read data onto data bus 30 and to OCD 20.

With IC 40 operating in the test mode compression of operation, TMCOMP signal 28 is active. Test read data from a desired memory cell of core 12 is placed onto data bus 30 and into TMCOMP circuit 22, which, as is known in the art, condenses the test read data. The condensed test read data is then placed onto data bus 30 and is thereby made available to MUX 18. The active TMCOMP signal 28 configures MUX 18 to pass the test read data to FIFO 14. After an adjustable number of clock cycles, LATCTRL circuit 16 makes latency signal LAT 32 active and thereby enables FIFO 14 to drive the test read data onto data bus 30 and to OCD 20.

Thus, it is seen that IC 40 includes two data paths. Normal or non-test mode compression data follows a first or read data path from core 12 through MUX 18 to FIFO 14 and then to OCD 20. Test read data follows a second or test data path from core 12 to TMCOMP circuit 22 through MUX 18 to FIFO 14 and then to OCD 20. In contrast to IC 10, the two separate data paths of IC 40 each include FIFO 14. Thus, both the normal read data and test mode data are read into FIFO 14. As described above, FIFO 14 places data onto data bus 30 after an adjustable number of clock cycles as determined or controlled by LATCTRL circuit 16. Thus, each of the separate data paths of IC 40 is provided with an adjustable latency, whereas IC 10 provides for adjustable latency only in the first or read data path.

The adjustable latency is provided in both data paths of IC 40 without requiring additional circuitry. Rather, the adjustable latency is provided in both data paths of IC 40 with less circuitry than included in IC 10, i.e., REG 24 is not included or required in IC 40 thereby saving space on substrate 34 of IC 40. Providing the second or test mode data path with adjustable latency provides increased flexibility to the operation of IC 40 while in the test mode compression mode of operation. More particularly, the adjustable latency in the test mode data path provides for adjustment of the number of cycles of CLK signal 26 that occur between a read of data from core 12 to the placement of that the data in OCD 20. The number of cycles of CLK signal 26 that occur between such a read of data from core 12 to the placement of that data in OCD 20 is no longer limited by the depth or size of REG 24. Thus, the frequency at which the test mode compression mode of operation is performed can be increased without changing the circuitry of the chip itself.

The adjustable latency provided in the test mode data path of IC 40 also enables test mode compression to be performed on test equipment that operates at a lower frequency and yet with IC 40 having a relatively short latency period. Such slower test equipment is generally less efficient, and thus less expensive. The adjustable latency period of IC 40 increases the efficiency of running test mode compression on such test equipment by decreasing the amount of time required to access data from IC 40.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:
1. An integrated circuit, comprising:
 a core memory array;
 a test mode compression circuit generating test mode data from data received from said core memory, array;
 a multiplexer receiving read data from said core memory array and receiving said test mode data from said test mode compression circuit, said multiplexer receiving a test mode compression signal, said multiplexer selectively transferring one of said read data and said test mode data dependent at least in part upon said test mode compression signals;

a first in first out register, said first in first out register receiving from said multiplexer said test mode data when said test mode compression signal is active, said first in first out register receiving from said multiplexer said read data when said test mode compression signal is not active; and a latency control circuit, said latency control circuit receiving a clock signal and issuing a latency control signal, said latency control signal being dependent at least in part upon said clock signal and being issued after a predetermined number of cycles of the clock signal, the predetermined number of cycles being adjustable;

wherein said first in first out register receives said latency control signal, said first in first out register shifting data dependent at least in part upon said latency control signal.

2. The integrated circuit of claim 1, wherein said first in first out register receives said latency control signal, said first in first out register shifting data dependent at least in part upon said latency control signal.

3. The integrated circuit of claim 1, further comprising an off chip driver, said off chip driver receiving data from said first in first out register.

4. A circuit for use with a memory array of an integrated circuit, said integrated circuit having a substrate, said circuit comprising:

a test mode compression circuit generating test mode data from data received from the memory array;

a multiplexer receiving read data from the memory array and receiving said test mode data from said test mode compression circuit, said multiplexer receiving a test mode compression signal, said multiplexer selectively transferring one of said read data and said test mode data dependent at least in part upon said test mode compression signal;

a first in first out register, said first in first out register receiving from said multiplexer said test mode data when said test mode compression signal is active, said first in first out register receiving from said multiplexer said read data when said test mode compression signal is not active; and a latency control circuit, said latency control circuit receiving a clock signal and issuing a latency control signal, said latency control signal being dependent at least in part upon said clock signal and being issued after a predetermined number of cycles of the clock signal, the predetermined number of cycles being adjustable;

wherein said first in first out register receives said latency control signal, said first in first out register shifting data dependent at least in cart upon said latency control signal.

5. The circuit of claim 4, wherein said first in first out register receives said latency control signal, said first in first out register shifting data dependent at least in part upon said latency control signal.

6. The circuit of claim 4, further comprising an off chip driver, said off chip driver receiving data from said first in first out register.

7. The circuit of claim 4, wherein said circuit is integral with the substrate of the integrated circuit.

8. A method for reading data from a memory army, comprising:

receiving a test mode compression signal;

reading read data from the memory array;

transferring the data into a register when said test mode compression signal is not active;

compressing the data and transferring the compressed data to said register when said test mode compression signal is active;

receiving a clock signal;

issuing a latency control signal dependent at least in part upon the clock signal; and shifting one of the data and the compressed data out of the register dependent at least in part upon the latency control signal, wherein the latency control signal is issued after a predetermined number of cycles of the clock signal, the predetermined number of cycles being adjustable.

* * * * *

UNITED STATES PATENT AND TRADEMARK OFFICE
CERTIFICATE OF CORRECTION

PATENT NO. : 7,139,943 B2 Page 1 of 1
APPLICATION NO. : 10/113386
DATED : November 21, 2006
INVENTOR(S) : Torsten Partsch et al.

It is certified that error appears in the above-identified patent and that said Letters Patent is hereby corrected as shown below:

Col. 6, line 23;
In claim 8, line 1, replace "army" with --array--.

Signed and Sealed this

Thirty-first Day of July, 2007

JON W. DUDAS
*Director of the United States Patent and Trademark Office*